(12) United States Patent
Roohparvar

(10) Patent No.: US 7,650,541 B2
(45) Date of Patent: Jan. 19, 2010

(54) MEMORY BLOCK QUALITY IDENTIFICATION IN A MEMORY DEVICE

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 584 days.

(21) Appl. No.: 11/440,348

(22) Filed: May 24, 2006

(65) Prior Publication Data

US 2006/0242484 A1    Oct. 26, 2006

Related U.S. Application Data

(63) Continuation of application No. 10/983,801, filed on Nov. 8, 2004, now Pat. No. 7,275,190.

(51) Int. Cl.
*G11C 29/00* (2006.01)
*G11C 7/00* (2006.01)

(52) U.S. Cl. .................. 714/723; 714/710; 365/200

(58) Field of Classification Search .............. 714/710, 714/711, 718, 723; 365/200–201
See application file for complete search history.

(56) References Cited

U.S. PATENT DOCUMENTS

| | | | | |
|---|---|---|---|---|
| 4,346,459 A * | 8/1982 | Sud et al. | ..................... | 365/200 |
| 4,380,066 A | 4/1983 | Spencer | | |
| 5,854,796 A * | 12/1998 | Sato | ........................... | 714/718 |
| 6,388,929 B1 | 5/2002 | Shimano | | |
| 6,405,323 B1 | 6/2002 | Lin | | |
| 6,445,602 B1 | 9/2002 | Kokudo | | |
| 6,621,750 B2 | 9/2003 | Okuyama | | |
| 6,738,943 B1 * | 5/2004 | Jen | ........................... | 714/756 |
| 6,781,898 B2 | 8/2004 | Kim | | |
| 6,792,500 B1 | 9/2004 | Herbst | | |
| 2002/0157048 A1 * | 10/2002 | Roohparvar | ................ | 714/723 |
| 2003/0080335 A1 | 5/2003 | Koyama | | |
| 2003/0090943 A1 | 5/2003 | Okuyama | | |
| 2004/0153947 A1 | 8/2004 | Beer | | |
| 2004/0233767 A1 * | 11/2004 | Wu et al. | .................... | 365/232 |

FOREIGN PATENT DOCUMENTS

WO    WO 2004055829 A1 *    7/2004

OTHER PUBLICATIONS

"Maximum likelihood estimation for failure analysis" by Yu et al. IEEE Transactions on Semiconductor Manufacturing ( IEEE Trans Semicond Manuf ) Nov. 4, 1998 (681-691) Publication Date: Dec. 1, 1998 ISSN: 0894-6507.*
"Quality memory blocks-balancing the trade-offs" by Prince This paper appears in: Quality Electronic Design, 2000. ISQED 2000. Proceedings. IEEE 2000 First International Symposium onPublication Date: 2000 On pp. 109-114 ISBN: 0-7695-0525-2.*

* cited by examiner

*Primary Examiner*—Cynthia Britt
(74) *Attorney, Agent, or Firm*—Leffert Jay & Polglaze, P.A.

(57) ABSTRACT

If a memory block in a flash memory device is found to have a defect, a memory block quality indication is generated in response to the type of memory defect. This indication is stored in the memory device. In one embodiment, the quality indication is stored in a predetermined location of the defective memory block. Using the quality indication, it can be determined if a system's error correction code scheme is capable of correcting data errors resulting from the defect.

17 Claims, 3 Drawing Sheets

MEMORY BLOCK QUALITY IDENTIFICATION IN A MEMORY DEVICE

RELATED APPLICATION

This Application is a Continuation of U.S. application Ser. No. 10/983,801, titled "MEMORY BLOCK QUALITY IDENTIFICATION IN A MEMORY DEVICE," filed Nov. 8, 2004 now U.S. Pat. No. 7,275,190 which is commonly assigned and incorporated herein by reference.

TECHNICAL FIELD OF THE INVENTION

The present invention relates generally to memory devices and in particular the present invention relates to a flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Unlike most semiconductor memory, flash memory devices can be sold with a limited quantity of defective memory blocks. Flash memory devices typically have a scheme to communicate the locations of the defective blocks to a controller or processor.

One such scheme employs markers at specific locations in the defective memory block. The markers are generated during the manufacturing and testing process before being sold to the user. When the user powers-up the memory device, the memory controller would go through these specific locations in memory and track the defective blocks. Since there can be thousands of memory blocks in a typical memory device, this is considerable overhead for the controller to handle.

Another problem with marking memory locations as defective is that if certain locations in a flash memory device are marked as defective, the device might have to be discarded. Additionally, integrated circuit manufacturers have to tag an entire memory block as bad even if it has only one bad bit in the field of 512 bytes. Both of these problems reduce the manufacturer's part yield, thus increasing the cost of the memory devices in an industry operating on slim profit margins.

For the reasons stated above, and for other reasons stated below which will become apparent to those skilled in the art upon reading and understanding the present specification, there is a need in the art for an improved method for handling defective memory blocks in a flash memory device.

DETAILED DESCRIPTION

Figure 1:
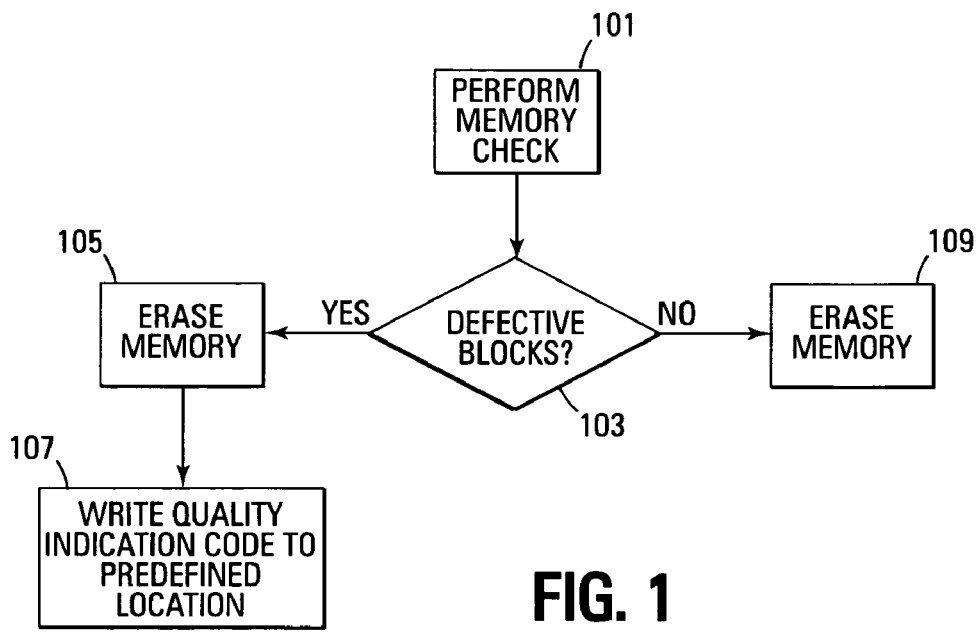
FIG. 1 shows a flowchart of one embodiment of a method for generating a memory block quality indication in a flash memory device.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a flowchart of one embodiment of a method for generating a memory block quality indication in a flash memory device. In one embodiment, this method would be performed during the manufacturing and testing processes at the memory device manufacturer. This reduces the overhead operations required of the memory controller. Alternate embodiments can be performed by the memory controller after the manufacturing process has been completed and the device is being operated by the user.

The method performs a memory check 101 to determine if any defective blocks are present in the memory array. This memory check is well known in the art and can comprise writing a predetermined pattern to the memory cells then reading the data out. If the pattern that was read out does not match what was written, the location is considered defective and the block should be marked as defective. The error detection may also check for bitlines that are shorted together, multilevel cells that have one or more defective bits, or other types of errors. The present invention is not limited to any one error checking routine.

If no defective memory blocks were found 103, the memory device is erased 109 to remove the memory check patterns. This device can then be used in a normal manner.

If defective memory blocks were found 103 during the memory check, the memory blocks can be erased 105 to remove the memory check patterns. However, instead of labeling the memory blocks as defective, unusable blocks, the method of the present invention describes the quality of the defective bits by generating a memory block quality indication.

In one embodiment, each different type of defect is assigned a code. For example, a bad column might be assigned a code of 01H, two bad columns might be assigned a code of 02H, and multiple defective bits in a cell can be assigned a code of 03H. Other defects can be assigned their own particular memory block quality indication code.

In another embodiment, a quality indication code table can be generated that uses a one byte word in which the first four bits indicates the type of error detected and the second four bits indicates the number of cells in the block that are affected by that particular error. For example, an error code of 34H might indicate that multiple defective bits in a cell have been found in four different cells. In still another embodiment, a code can be assigned (e.g., AAH) that indicates that the memory block is so defective as to be unusable. The present invention is not limited to any one particular coding scheme.

The memory block quality indication code is written to a predetermined location in the particular block 107 with the error. In one embodiment, each block has a certain predefined location set aside that is used only for the quality indication code. In another embodiment, the quality indication code for each defective block can be stored in a non-volatile register, separate from the main memory array, with an indication to which block it pertains.

Figure 2:
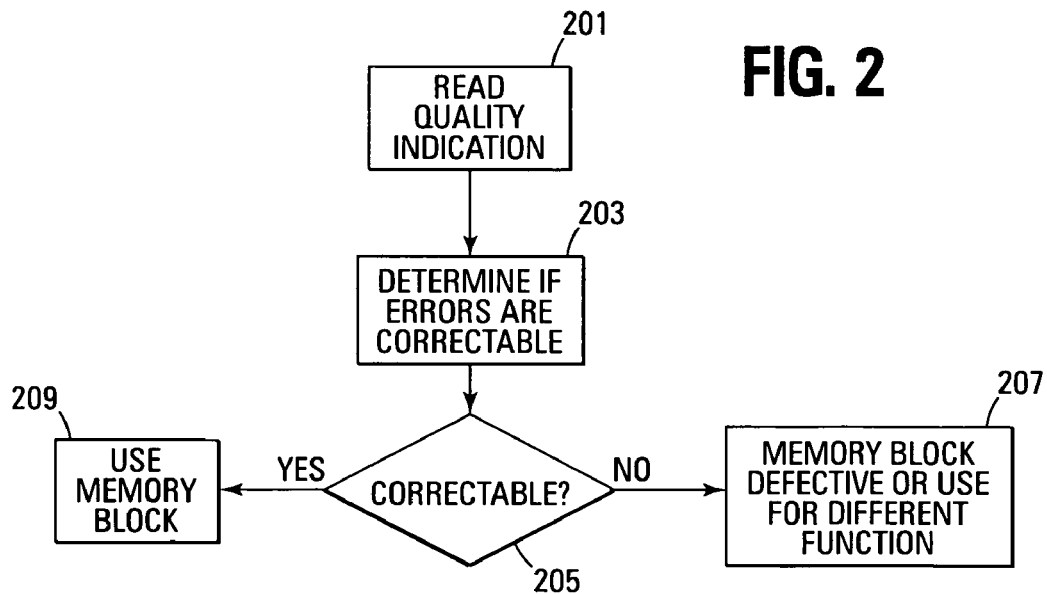
FIG. 2 shows a flowchart of one embodiment of a method for implementing the memory block quality indication of the present invention.

FIG. 2 illustrates a flowchart of one embodiment of a method in which the quality indication code of the present invention is used. A memory device comprising the quality indication code can be used in a system with a processor that executes an error correction code scheme. The system reads the quality indication code as generated previously 201. It can then be determined if any errors resulting from the defective memory can be corrected 203. For example, the system might have a strong ECC scheme and can correct errors. Alternatively, the system may not have an ECC scheme or it may only be a weak scheme.

If the system has a weak ECC scheme 205, data stored in the defective memory locations may not be correctable. In this case, any data pattern other than the erased data pattern (e.g., FFH) found in the block might be considered to be a defective block 207. The block can then be indicated as a defective block using some type of defective block indication scheme or the part may be destroyed. In an alternate embodiment, the system might allocate the defective memory for storing only data (e.g., picture, sound, program code) that will not be affected by the types of errors that might be generated by the defective memory.

If the system has a stronger ECC scheme 205, the ECC might be able to correct most data errors caused by most types of defects in the memory block. In this type of device, the memory block can be used 209 and the system designer might decide to allocate a portion of the ECC correction to the initial defects and another portion of the ECC for memory block failures that occur in the field.

ECC schemes are used to improve the quality of data in systems. ECC schemes are well known in the art and include Reed-Solomon and BCH as well as many others. Reed-Solomon works on groups of bits as opposed to bit level error correction. BCH provides multilevel, cyclic error correction. These and other error detection/correction schemes can provide improved data storage for the embodiments of the present invention.

Flash memory devices that incorporate the embodiments of the memory block quality indication method of the present invention may be manufactured in a NOR architecture, a NAND architecture, or some other type of flash memory. In a NOR configuration, the cells are arranged in a matrix. The gates of each floating gate memory cell of the array matrix are connected by rows to wordlines and their drains are connected to column bitlines. The source of each floating gate memory cell is typically connected to a common source line.

Figure 3:
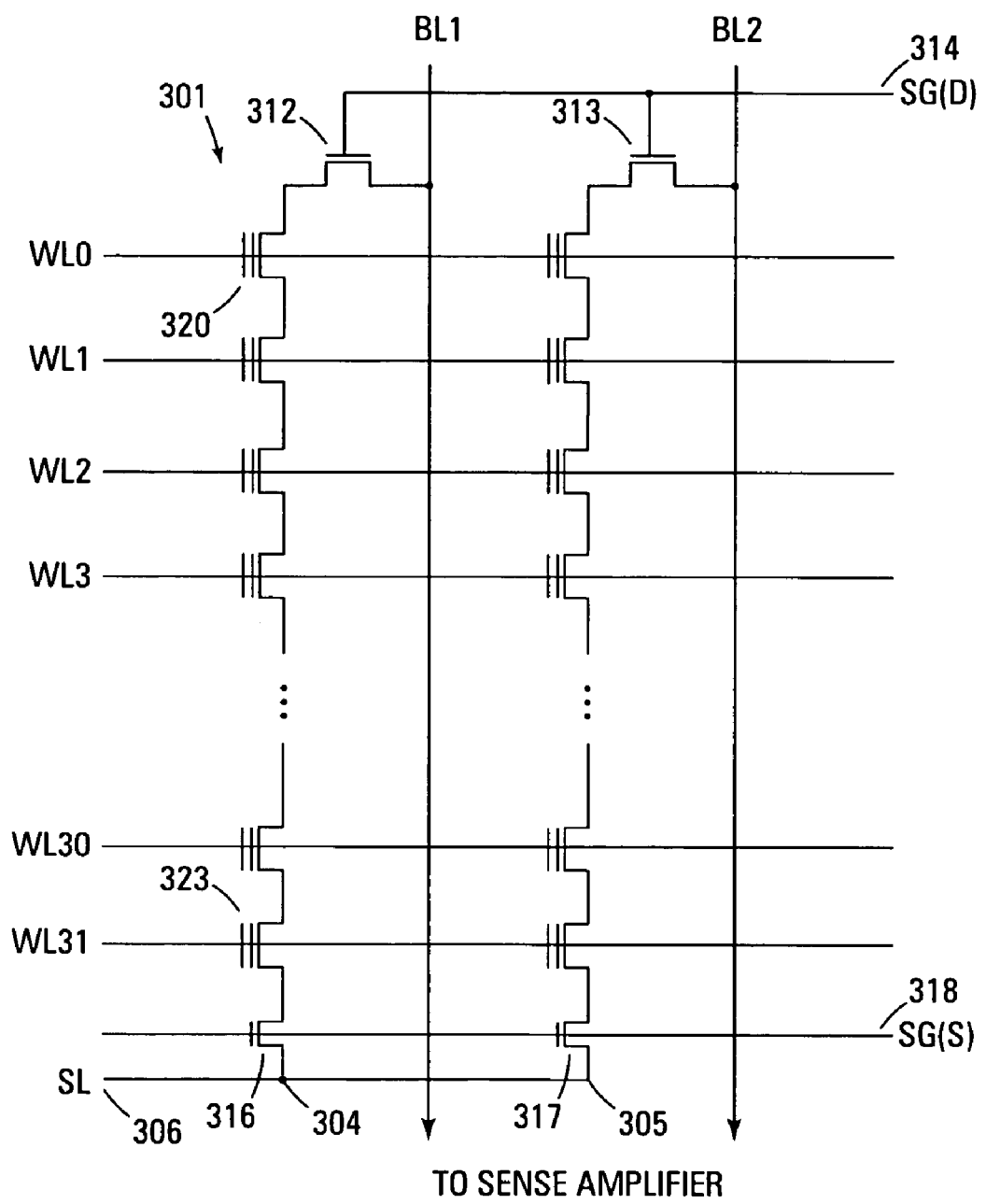
FIG. 3 shows a schematic diagram of one embodiment of a NAND flash memory array of the present invention.

FIG. 3 illustrates a simplified diagram of a typical NAND flash memory array of the present invention. The memory array of FIG. 3, for purposes of clarity, does not show all of the elements typically required in a memory array. For example, only two bitlines are shown (BL1 and BL2) when the number of bitlines required actually depends upon the memory density. The bitlines are subsequently referred to as (BL1-BLN).

The array is comprised of an array of floating gate cells 301 arranged in series strings 304, 305. Each of the floating gate cells 301 are coupled drain to source in each series chain 304, 305. A word line (WL0-WL31) that spans across multiple series strings 304, 305 is coupled to the control gates of every floating gate cell in a row in order to control their operation. The bitlines (BL1-BLN) are eventually coupled to sense amplifiers (not shown) that detect the state of each cell.

In operation, the wordlines (WL0-WL31) select the individual floating gate memory cells in the series chain 304, 305 to be written to or read from and operate the remaining floating gate memory cells in each series string 304, 305 in a pass through mode. Each series string 304, 305 of floating gate memory cells is coupled to a source line 306 by a source select gate 316, 317 and to an individual bitline (BL1-BLN) by a drain select gate 312, 313. The source select gates 316, 317 are controlled by a source select gate control line SG(S) 318 coupled to their control gates. The drain select gates 312, 313 are controlled by a drain select gate control line SG(D) 314.

Each cell can be programmed as a single bit per cell (SBC) or multiple bits per cell (i.e., multilevel cell—MLC). Each cell's threshold voltage ($V_t$) determines the data that is stored in the cell. For example, in a single bit per cell, a $V_t$ of 0.5V might indicate a programmed cell while a $V_t$ of −0.5V might indicate an erased cell. The multilevel cell may have multiple $V_t$ windows that each indicates a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

During a typical prior art programming operation, the selected wordline for the flash memory cell to be programmed is biased with a programming pulse at a voltage that is greater than 16V. A verification operation with a wordline voltage of 0V is then performed to determine if the floating gate is at the proper voltage (e.g., 0.5V). The unselected wordlines for the remaining cells are typically biased at approximately 10V during the program operation. Each of the memory cells is programmed in a substantially similar fashion.

Figure 4:
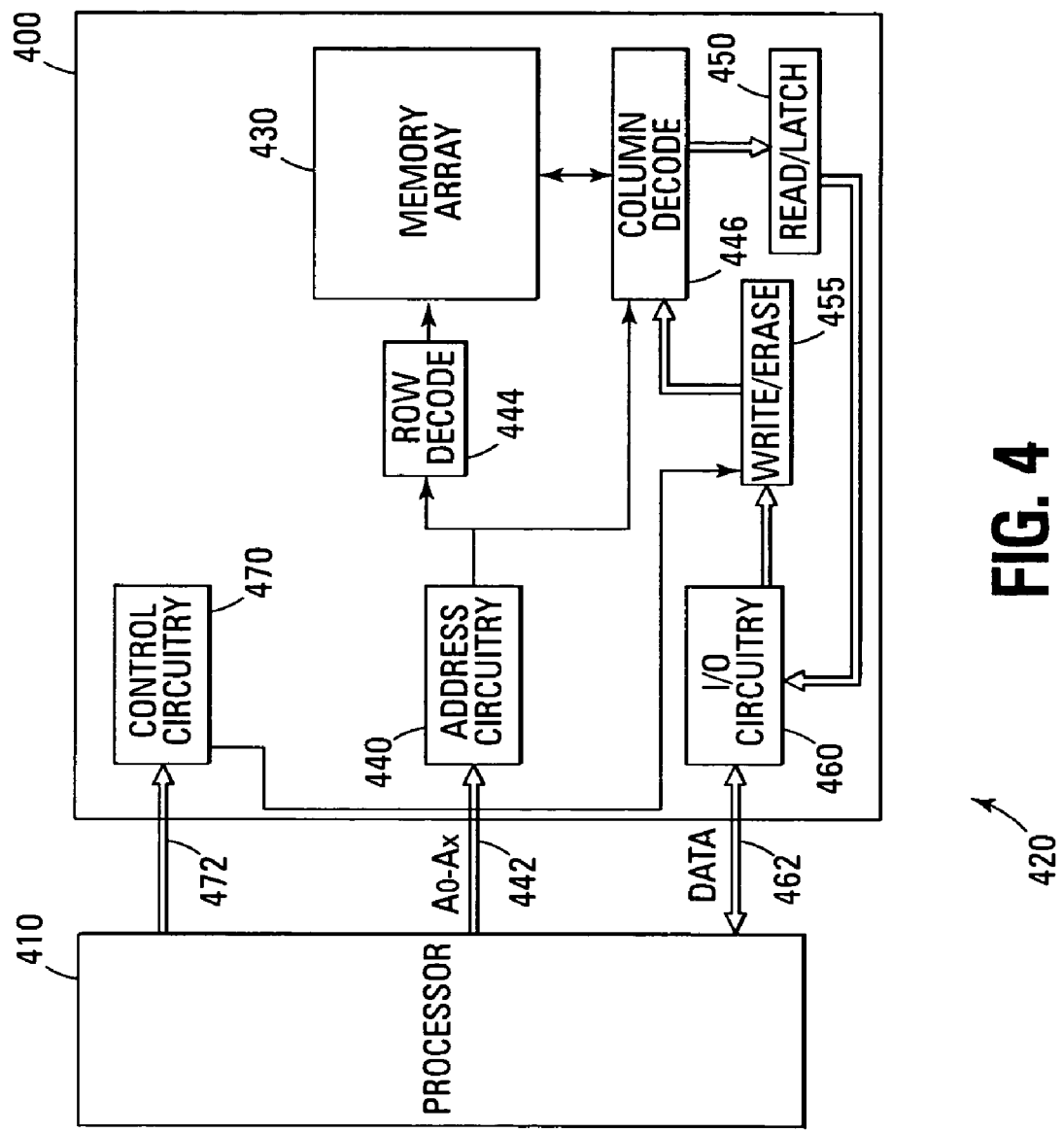
FIG. 4 shows a block diagram of one embodiment of an electronic system of the present invention.

FIG. 4 illustrates a functional block diagram of a memory device 400 that is coupled to a processor 410. The processor 410 may be a microprocessor or some other type of controlling circuitry. The memory device 400 and the processor 410 form part of a memory system 420 of the present invention. The processor 410 is capable of generating memory commands to the memory device 400 as well as executing any ECC scheme that is necessary for a desired operation of the system. The memory device 400 has been simplified to focus on features of the memory that are helpful in understanding the present invention.

The array of flash memory cells 430 may be comprised of the flash memory cells as described previously with reference to FIG. 3. In an alternate embodiment, the memory array 430 is a NOR memory array or some other memory array architecture.

The memory array 430 is arranged in banks of rows and columns. The control gates of each row of memory cells is coupled with a wordline while the drain and source connections of the memory cells are coupled to bitlines. As is well known in the art, the connections of the cells to the bitlines determines whether the array is a NAND architecture or a NOR architecture.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense/buffer circuitry 450. The sense/buffer circuitry, in one embodiment, is coupled to read and latch a row of data from the memory array 430. Data input and output buffer circuitry 460 is included for bi-directional data communication over a plurality of data connections 462 with the controller 410. Write circuitry 455 is provided to write data to the memory array.

Control circuitry 470 decodes signals provided on control connections 472 from the processor 410. These signals are used to control the operations on the memory array 430, including data read, data write (program), and erase operations. The control circuitry 470 may be a state machine, a sequencer, or some other type of controller.

The flash memory device illustrated in FIG. 4 has been simplified to facilitate a basic understanding of the features of the memory. A more detailed understanding of internal circuitry and functions of flash memories are known to those skilled in the art.

CONCULSION

In summary, the embodiments of the memory block quality identification method of the present invention provide a flash memory device with a defective memory block indication that includes the type of defect present in the block. The memory defect quality indication can be generated by the manufacturer and used with the strength of the error correction code of the memory device to determine which defective memory blocks are still usable. Thus the manufacturer may be able to use some memory parts that were previously marked as defective if the system ECC can correct for a particular type of defect in a block.

The memory block quality identification of the present invention also provides a memory user with the option of using a memory device even if ECC is not used. For example, if an end user is storing both program code and other data (e.g., picture or sound data) in the memory device, an error in one of the code bits can cause an entire program to crash while an error in one of the other data bits might not even be noticeable. If a bit fails in the field, the quality indication gives the system the option of deciding whether data or program code is stored in the memory block containing the bad location.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for generating a memory block quality indication in a memory device comprising a plurality of memory blocks, the method comprising:
    determining a first memory block, of the plurality of memory blocks, that comprises a memory defect; and
    generating the memory block quality indication in response to the memory defect wherein the memory block quality indication comprises a first set of bits indicating a type of defect and a second set of bits indicating a quantity of memory cells in the first memory block having the type of defect.

2. The method of claim 1 wherein determining the first memory block comprising a memory defect includes performing a memory check on at least one of the plurality of memory blocks.

3. The method of claim 2 wherein the memory check comprises:
    writing a predetermined pattern to the at least one memory block; and
    attempting to read the predetermined pattern from the at least one memory block.

4. The method of claim 1 wherein the memory device comprises a NAND architecture flash memory device.

5. The method of claim 1 wherein the memory device comprises a NOR architecture flash memory device.

6. The method of claim 1 wherein the memory block quality indication indicates that a cell has at least one defective bit.

7. The method of claim 1 wherein the memory block quality indication indicates that two bitlines are shorted together.

8. A method for generating a memory block quality indication in a flash memory device comprising a plurality of memory blocks, the method comprising:
    performing a memory check on at least one memory block of the plurality of memory blocks;
    determining, in response to the memory check, which of the plurality of memory blocks comprise a memory defect; and
    generating the memory block quality indication in response to each memory defect wherein the memory block quality indication comprises a first set of bits indicating a type of memory defect and a second set of bits indicating a quantity of memory cells in a defective memory block having the type of memory defect.

9. The method of claim 8 and further comprising:
    erasing each memory block after generating the memory block quality indication; and
    storing the memory block quality indication in a predetermined location.

10. The method of claim 8 wherein the memory check comprises writing a predetermined pattern to and attempting to read the predetermined pattern from each memory location in each memory block being checked.

11. The method of claim 8 wherein each memory block quality indication comprises a code indicating a type of memory defect.

12. The method of claim 8 wherein each memory block quality indication comprises a table including the type of defect and the quantity of memory cells in the checked block having that type of memory defect.

13. The method of claim 12 wherein the table is stored in the memory block with the respective memory defect.

14. The method of claim 8 wherein the memory block quality indication comprises a code indicating that a defective memory block is unusable.

15. A flash memory device comprising:
 a memory array comprising a plurality of memory blocks; and
 a memory control circuit, coupled to the plurality of memory blocks, for generating a memory block quality indication code, the control circuit configured to perform a memory check on at least one of the plurality of memory blocks and generate the memory block quality indication code in response to the memory check wherein the memory block quality indicated code comprises a first set of bits indicating a type of defect and a second set of bits indicating a quantity of memory cells in a memory block having the type of defect.

16. The device of claim 15 wherein the control circuit is further configured to, in response to the memory block quality indication code, change a type of data stored in predetermined defective memory blocks.

17. A memory system comprising:
 a processor for generating memory signals; and
 a flash memory device coupled to the processor and operating in response to the memory signals, the device comprising:
  a memory array comprising a plurality of memory blocks; and
  a memory control circuit, coupled to the plurality of memory blocks, for generating a memory block quality indication code, the control circuit configured to perform a memory check on at least one of the plurality of memory blocks and generate the memory block quality indication code in response to the memory check wherein the memory block quality indication code comprises a first set of bits indicating a type of defect and a second set of bits indicating a quantity of memory cells in a memory block having the type of defect.

* * * * *

UNITED STATES PATENT AND TRADEMARK OFFICE
CERTIFICATE OF CORRECTION

PATENT NO. : 7,650,541 B2 Page 1 of 1
APPLICATION NO. : 11/440348
DATED : January 19, 2010
INVENTOR(S) : Frankie F. Roohparvar It is certified that error appears in the above-identified patent and that said Letters Patent is hereby corrected as shown below:

In column 7, line 13, in Claim 15, delete "indicated" and insert -- indication --, therefor.

Signed and Sealed this

Twenty-third Day of March, 2010

David J. Kappos
*Director of the United States Patent and Trademark Office*

UNITED STATES PATENT AND TRADEMARK OFFICE
CERTIFICATE OF CORRECTION

PATENT NO.        : 7,650,541 B2
APPLICATION NO.   : 11/440348
DATED             : January 19, 2010
INVENTOR(S)       : Frankie F. Roohparvar It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 824 days.

Signed and Sealed this

Twenty-third Day of November, 2010

David J. Kappos
*Director of the United States Patent and Trademark Office*